United States Patent [19]

Sue et al.

[11] Patent Number: 5,459,223

[45] Date of Patent: Oct. 17, 1995

[54] METHOD OF PREPARING NAPHTHOL-MODIFIED PHENOLIC RESIN

[75] Inventors: Haruaki Sue; Shinsuke Hagiwara; Hiroyuki Saitoh, all of Shimodate, Japan

[73] Assignee: Hitachi Chemical Company, Tokyo, Japan

[21] Appl. No.: 193,468

[22] Filed: Feb. 8, 1994

[30] Foreign Application Priority Data

Jan. 22, 1993 [JP] Japan .................................. 5-023142
Mar. 23, 1993 [JP] Japan .................................. 5-062381

[51] Int. Cl.$^6$ ............................. C08G 8/04; C08G 14/04
[52] U.S. Cl. ..................... 528/153; 528/129; 528/137; 528/143; 528/155; 525/480; 525/481; 525/501; 525/534
[58] Field of Search ..................... 525/480, 481, 525/501, 534; 528/129, 137, 143, 153, 155

[56] References Cited

U.S. PATENT DOCUMENTS

| | | | |
|---|---|---|---|
| 3,862,260 | 1/1975 | Sellers et al. | 528/153 |
| 4,404,357 | 9/1983 | Taylor et al. | 528/153 |
| 4,424,315 | 1/1984 | Taylor et al. | 528/153 |
| 5,023,311 | 6/1991 | Kubota | 528/153 |
| 5,206,333 | 4/1993 | Sue et al. | 528/153 |
| 5,302,673 | 4/1994 | Naka et al. | 528/153 |

FOREIGN PATENT DOCUMENTS

| | | |
|---|---|---|
| 117023 | 3/1930 | Austria. |
| 0429667 | 6/1991 | European Pat. Off.. |
| 1745326 | 8/1971 | Germany. |
| 4119552 | 12/1991 | Germany. |

OTHER PUBLICATIONS

Patent Abstracts of Japan, vol. 17, No. 668, 9 Dec. 1993.

*Primary Examiner*—Robert E. Sellers
*Assistant Examiner*—Randy Gulakowski
*Attorney, Agent, or Firm*—Antonelli, Terry, Stout & Kraus

[57] ABSTRACT

A naphthol-modified phenolic resin having low softening point and good flowability is obtained by allowing a naphthol and a phenol to react with an aldehyde in the presence of an acid catalyst at 60° to 110° C. to obtain a primary reaction mixture, heating the primary reaction mixture in the presence of a strong acid, a super acid or a mixture thereof under ambient pressure at 120° to 180° C. for 1 to 12 hours to obtain a secondary reaction mixture, and subjecting the secondary reaction mixture to vacuum concentration or steam distillation, and the naphthol-modified phenolic resin is suited to use as a curing agent in epoxy resin molding materials for sealing electronic parts.

9 Claims, 4 Drawing Sheets

METHOD OF PREPARING NAPHTHOL-MODIFIED PHENOLIC RESIN

BACKGROUND OF THE INVENTION (1) Field of the Invention

The present invention relates to a method of preparing a naphthol-modified phenolic resin which is a suitable curing agent for epoxy resins, and to an epoxy resin molding material for sealing electronic parts which contains the naphthol-modified phenolic resin prepared by the method.

The epoxy resin molding material for sealing electronic parts of the present invention is suited to production of VLSIs (very large scale integrated circuits) which require both a high glass transition temperature and an excellent resistance to fellow cracking.

(2) Description of the Related Art

Epoxy resin molding materials have been used widely to seal electronic parts, such as transistors and ICs. The reason is that epoxy resins are well balanced in properties including electrical properties, moisture resistance, heat resistance, mechanical properties and adhesive properties to inserted parts. In particular, epoxy resin molding materials composed of o-cresol novolac epoxy resins and phenol novolac curing agents are particularly well balanced in these properties and are now mainly used as the base resins of molding materials for sealing ICs.

ICs have been thinned and downsized for high density mounting on printed wiring boards. Thinned and downsized packages however are apt to crack during mounting by soldering (fusing step). This is the problem pertaining to ICs for surface mounting that is to be solved at present. One means proposed for solving this problem is molding such thin packages, such as TSOPs (thin small outline packages), by using a sealing material containing a biphenyl skeleton epoxy resin [Japanese Patent Application Kokai Koho (Laid-open) No. 58-39677]. Biphenyl skeleton epoxy resins have low hygroscopicity and high moisture resistance, and sealing materials containing the epoxy resins exhibit excellent resistance to fellow cracking.

However, when cured with phenol novolac resins, the biphenyl skeleton epoxy resins suffer a decrease in glass transition temperature. To solve this problem, it has been tried to modify phenol novolac resins by introduction of various substituents or naphthol skeletons [Japanese Patent Application Kokai Koho (Laid-open) No. 4-199856].

However, introduction of very bulky substituents or rigid skeleton structures, such as naphthol skeletons, into curing agents adversely affects the softening point and flowability of molding materials for sealing ICs, and has not yet been put into practical application.

SUMMARY OF THE INVENTION

The present invention has been made in consideration of such circumstances, and an object of the present invention is to provide a method of preparing a naphthol-modified phenolic resin which is a suitable curing agent for epoxy resins, and yet to an epoxy resin molding material for sealing electronic parts which contains the naphthol-modified phenolic resin and has high glass transition temperature and excellent resistance to reflow cracking.

The inventors completed the present invention on the basis of their finding that the molecule structure, molecular weight and molecular weight distribution of phenolic resins used as curing agents influence the glass transition temperature and resistance to reflow cracking of epoxy resin molding materials for sealing electronic parts.

The present invention provides a method of preparing a naphthol-modified phenolic resin comprising allowing a naphthol and a phenol to react with an aldehyde in the presence of an acid catalyst at 60° to 110° C. to obtain a primary reaction mixture, heating the primary reaction mixture in the presence of an acid catalyst selected from the group consisting of a strong acid, a super acid and a mixture thereof, under ambient pressure, at 120° to 180° C., for 1 to 12 hours, to obtain a secondary reaction mixture, and subjecting the secondary reaction mixture to vacuum concentration and/or steam distillation to obtain the naphthol-modified phenolic resin (hereinafter, the above method will sometimes be referred to as "method A").

The present invention also provides a method of preparing a naphthol-modified phenolic resin by using a phenolic resin as a starting material in place of the naphthol, phenol and aldehyde (hereinafter, this method will sometimes be referred to as "method B"). The method B comprises adding a naphthol, a phenol and an acid catalyst selected from the group consisting of a strong acid, a super acid and a mixture thereof to a phenolic resin to obtain a mixture, heating the mixture under ambient pressure at 120° to 180° C. for 1 to 12 hours to obtain a reaction mixture, and subjecting the reaction mixture to vacuum concentration and/or steam distillation to obtain the naphthol-modified phenolic resin.

Although the naphthol-modified phenolic resins prepared by the method A and method B of the present invention contain naphthol skeletons, these resins have lower softening point and better flowability as compared with conventional naphthol-modified phenolic resins, and can be prepared in high productivity. Using the naphthol-modified phenolic resins prepared by the method A and method B as curing agents in epoxy resin molding materials provides molding materials having good moldability, and the naphthol skeletons prevent the decrease in the glass transition temperature of the molding materials.

The present invention further provides an epoxy resin molding material for sealing electronic parts which comprises an epoxy resin, the naphthol-modified phenolic resin obtained by the method A or method B, and an inorganic filler.

The epoxy resin molding material for sealing electronic parts is excellent particularly in moldability, heat resistance, such as resistance to reflow cracking, and moisture resistance.

DESCRIPTION OF THE PREFERRED EMBODIMENT

Figure 1:
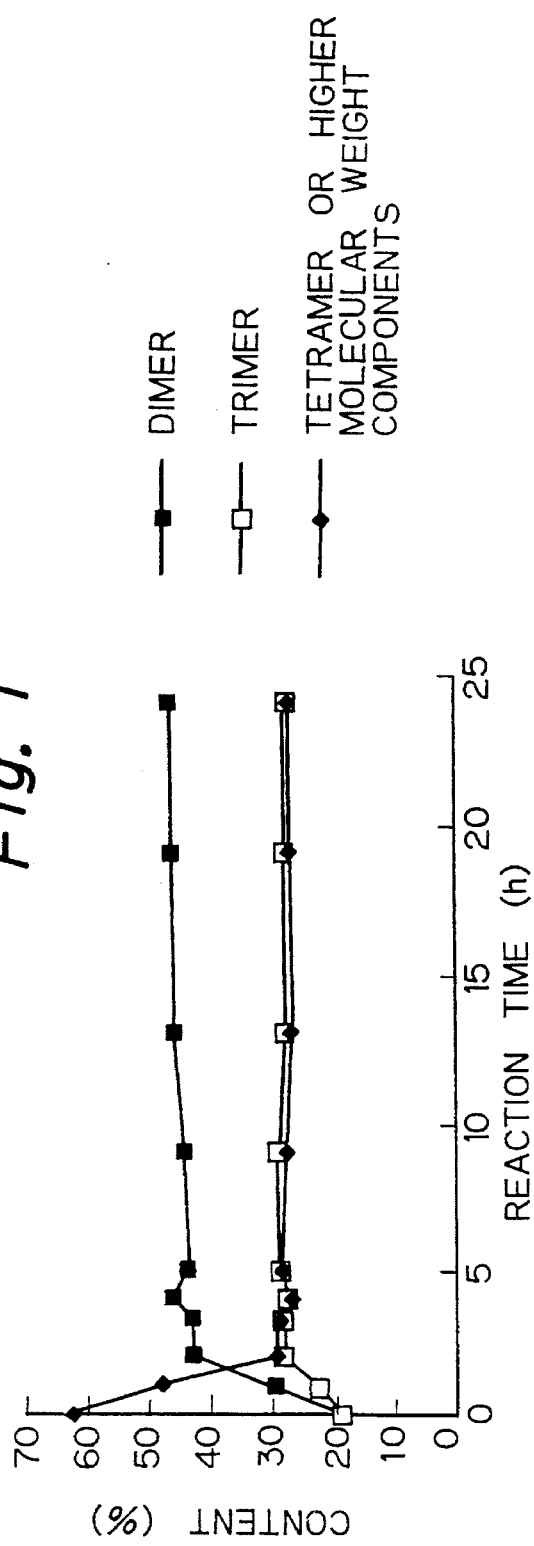
FIG. 1 is a graph representing the relationship between reaction time and composition of reaction product during the reaction of Example 1 which is an embodiment according to the present invention.

Some examples of the naphthol to be used in the method A include 1-naphthol, 2-naphthol, 1,5-dihydroxynaphthalene, 1,6-dihydroxynaphthalene, 1,7-dihydroxynaphthalene and 2,7-dihydroxynaphthalene. These naphthols may be used individually or in combination of two or more.

Some examples of the phenol to be used in the method A include known phenolic compounds which have generally been used for the preparation of phenolic resins, for example, phenol, o-cresol, p-cresol, m-cresol, butylphenols, xylenols, nonylphenols and fluorene-type phenols, such as 9,9-bis(4-hydroxyphenyl)fluorene. These phenols may be used individually or in combination of two or more.

In the method A, the naphthol is used in an amount of 20 to 90 mol %, preferably 30 to 85 mol %, based on the total of the naphthol and the phenol. If the amount of the naphthol is less than 20 mol %, the resulting naphthol-modified phenolic resin will not be improved sufficiently in heat resistance and moisture resistance. An amount of the naphthol of more than 90 mol % will raise the softening point and melt viscosity of the resulting naphthol-modified phenolic resin.

The aldehyde to be used in the method A may be any one selected from those which have conventionally been used for the synthesis of phenolic resins, and some examples include formaldehyde, acetaldehyde, benzaldehyde and salicylaldehyde. These aldehydes may be used individually or in combination of two or more.

In the method A, 0.3 to 1.0 mol, preferably 0.4 to 0.6 mol of the aldehyde is used per mol of the total of the naphthol and the phenol.

The method A comprises the following three stages.

The first stage is initial polymerization, in which the naphthol and the phenol are allowed to react with the aldehyde at 60° to 110° C. in the presence of an acid catalyst. The second stage is splitting-recombining reaction, in which the primary reaction mixture resulting from the first stage is further heated under ambient pressure at 120° to 180° C. for 1 to 12 hours in the presence of an acid catalyst selected from the group consisting of a strong acid, a super acid and a mixture thereof. The third stage is a stage for removing unreacted monomers or the like from the secondary reaction mixture resulting from the second stage, and in this stage, the secondary reaction mixture is subjected to vacuum concentration and/or steam distillation to obtain the objective naphthol-modified phenolic resin.

The acid catalyst to be used in the first stage may be any one selected from those which have been used for the conventional synthesis of phenolic resins, and some examples include a weak acid, such as oxalic acid, acetic acid and formic acid, a strong acid, such as hydrochloric acid, sulfuric acid, nitric acid, p-toluenesulfonic acid and halogenated acetic acids, and a super acid, such as trifluoromethanesulfonic acid, methanesulfonic acid and pentafluoroethanesulfonic acid. The term "super acid" as used herein denotes acids having an acid strength higher than that of 100% sulfuric acid. Acid strength is represented by Hammett's acidity function ($H_o$). For example, the acid strength of 100% sulfuric acid is −11.93, and that of trifluoromethanesulfonic acid is −14.6. These acid catalysts may be used individually or in combination of two or more.

For example, when the reaction of the first stage is carried out in the presence of an acid catalyst selected from the group consisting of the strong acid, the super acid and a mixture thereof, the reaction of the second stage may be carried out without addition of these catalysts. In this case, the preferred amount of the strong acid and/or super acid is generally 0.0001 to 0.2 mol, preferably 0,001 to 0.1 mol per mol of the total of the naphthol and the phenol.

When a weak acid is used as the acid catalyst in the first stage, it is generally desirable to use 0,001 to 0.5 mol, preferably 0.01 to 0.1 mol of the weak acid per mol of the total of the naphthol and the phenol. When a weak acid is used as the acid catalyst in the first stage, it is necessary to add an acid catalyst selected from the group consisting of the strong acid, the super acid and a mixture thereof in the second stage.

The initial polymerization in the first stage is generally carried out at 60° to 110° C., preferably 80° to 110° C. In general the initial polymerization is desirably carried out under reflux. The reaction time of the initial polymerization depends on the kind and amount of the catalyst, the reaction temperature or the like and cannot be defined uniformly. The time of the initial polymerization is generally 1 to 24 hours, preferably 2 to 6 hours.

The splitting-recombining reaction in the second stage requires the presence of the acid catalyst selected from the group consisting of the strong acid, the super acid and a mixture thereof. The examples of the strong acid and super acid to be used in the second stage are the same ones as those exemplified in the description of the first stage. The amount of the acid catalyst selected from the group consisting of the strong acid, the super acid and a mixture thereof required in the second stage is generally 0.0001 to 0.2 mol, preferably 0.001 to 0.1 mol per mol of the total of the naphthol and phenol that are used as the raw materials for the initial polymerization. When the strong acid and/or super acid is used in such an amount in the first stage, further addition is not required in the second stage. When the acid catalyst used in the first stage is a weak acid, the strong acid and/or super acid should be added in the above-described amount in the second stage.

The splitting-recombining reaction is carried out under ambient pressure at 120° to 180° C., preferably 130° to 170° C., for 1 to 12 hours, preferably 2 to 8 hours. During the reaction, condensed water or the like are distilled away from the reaction system, and equilibrium is reached. In the meantime there occur both splitting and recombination of methylene chains, to decrease molecular weight and molecular weight distribution.

In the third stage, the secondary reaction mixture resulting from the splitting-recombining reaction of the second stage is subjected to vacuum concentration and/or steam distillation, to remove unreacted monomers. The vacuum concentration is generally carried out at 230° C. or lower, preferably 150° to 200° C. After the unreacted monomers in the resulting resin reached a predetermined amount, the resulting resin is taken out from the reaction vessel used and is then cooled, to obtain the objective naphthol-modified phenolic resin.

By conventional methods, phenolic resins, particularly novolac resins have been prepared by carrying out initial polymerization at 80° C. to distillation temperature, then raising temperature, followed by vacuum distillation. In the conventional methods, the average molecular weight increases and the molecular distribution widens as the time proceeds during the course from the initial polymerization (reflux reaction) to the vacuum concentration, thereby increasing melt viscosity and softening point. A known means for obtaining phenolic resins of desired molecular weight and softening point is changing the molar ratio between phenols and aldehydes which are used as starting materials. This method however is inferior in yield because it needs decreasing the amount of aldehydes to obtain phenolic resins of low molecular weight and low polydispersity coefficient.

In the method of the present invention, the reaction that follows the initial polymerization and is carried out in the presence of the strong acid and/or super acid under ambient pressure at 120° to 180° C. for 1 to 12 hours causes splitting and recombination of methylene chains, to decrease the molecular weight and narrow the molecular weight distribution. Particularly, phenolic resins containing naphthols exhibit remarkable decreases in both molecular weight and polydispersity coefficient.

Figure 2:
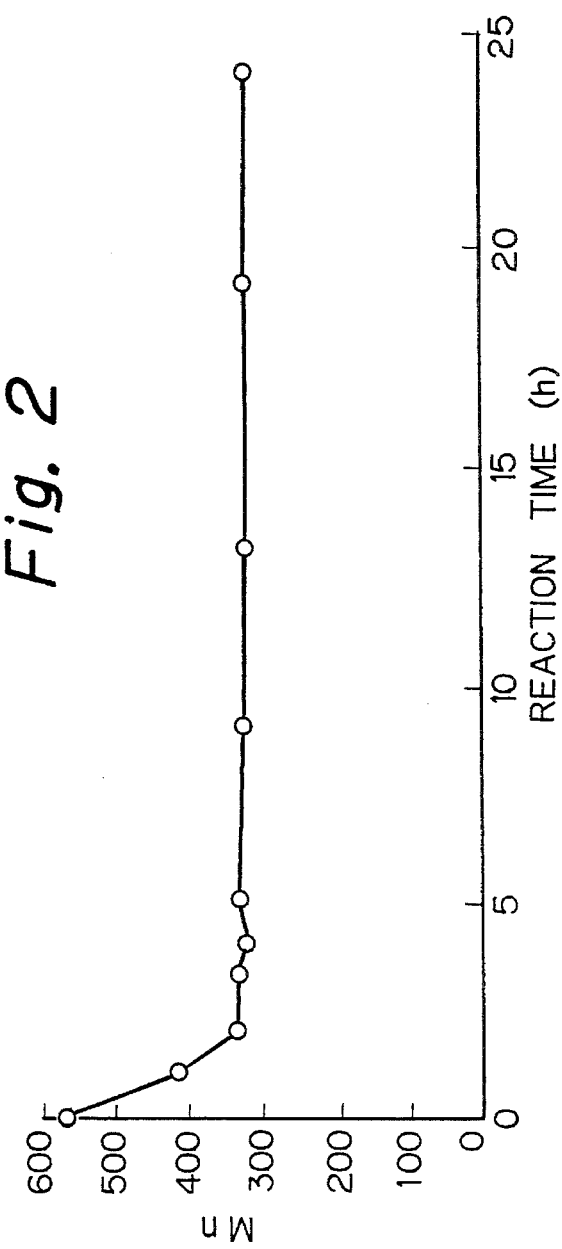
FIG. 2 is a graph representing the relationship between reaction time and number average molecular weight of reaction product during the reaction of Example 1 which is an embodiment according to the present invention.
Figure 3:
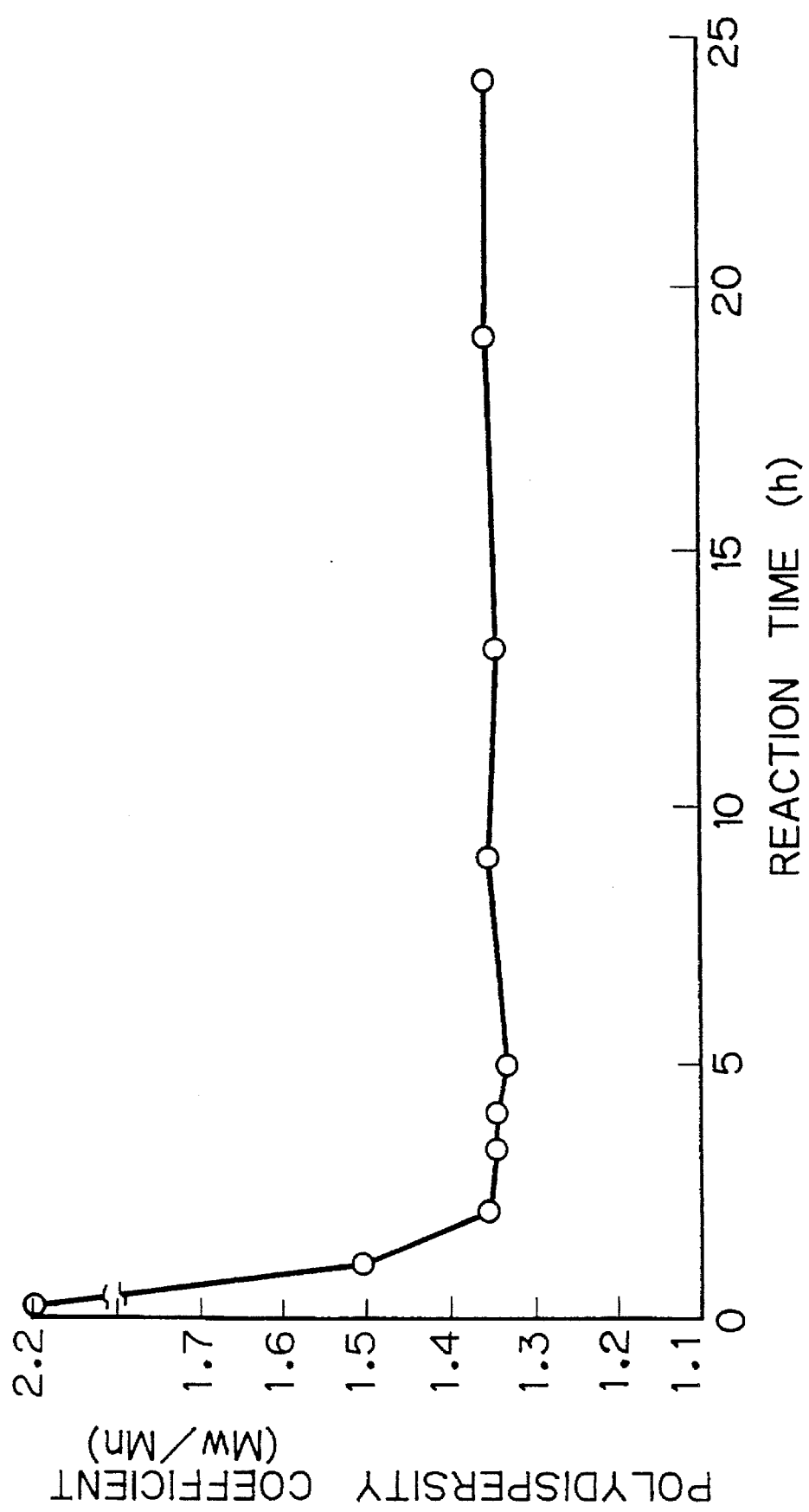
FIG. 3 is a graph representing the relationship between reaction time and polydispersity coefficient of reaction product during the reaction of Example 1 which is an embodiment according to the present invention.

Reactions were carried out several times with the same ratios of starting materials as those in the following Example 1 to investigate by GPC the changes in molecular weight and polydispersity coefficient (Mw/Mn) during the splitting-recombining reaction. The results are shown in FIGS. 1 to 3. These figures show that molecular weight and polydispersity decrease in a short time. As shown in FIG. 1 representing the change of the reaction product with the passage of time, this seems to be caused by the splitting of tetramet or higher molecular weight components to dimer and tetramet. The method of the present invention generally produces phenolic resins (exclusive of the unreacted monomers) having a number average molecular weight of 250 to 650 and a polydispersity coefficient (Mw/Mn) of 1.6 or less.

The method B of the present invention utilizes as a starting material a phenolic resin instead of the naphthol, phenol and aldehyde used in the method A, and after a naphthol, a phenol and an acid catalyst selected from the group consisting of a strong acid, a super acid and a mixture thereof are added to the phenolic resin, splitting-recombining reaction and removal of unreacted monomers are carried out in the same manner as in the method A, to obtain a naphthol-modified phenolic resin.

Due to the splitting-recombining reaction, the naphthol-modified phenolic resin obtained by the method B has a molecular weight and a molecular weight distribution which are different from those of the starting phenolic resin. The resulting naphthol-modified phenolic resin contains naphthol skeleton, and the molecular weight and polydispersity coefficient thereof are reduced as compared with the starting phenolic resin.

The phenolic resin to be used in the method B of the present invention is not particularly limited, and it is generally preferable to use a novolac phenolic resin which is a reaction product of a phenol and a naphthol with an aldehyde. Some examples of the phenol which may be used for the synthesis of the starting phenolic resin are those that have conventionally been used for the synthesis of conventional phenolic resins, such as phenol, o-cresol, p-cresol, m-cresol, butylphenols, xylenols, nonylphenols and fluorene-type phenols. These phenols may be used individually or in combination of two or more. Some examples of the naphthol which may be used for the synthesis of the starting phenolic resin include 1-naphthol, 2-naphthol, 1,5-dihydroxynaphthalene, 1,6-dihydroxynaphthalene, 1,7-dihydroxynaphthalene and 2,7-dihydroxynaphthalene. These naphthols may be used individually or in combination of two or more. The phenolic resin to be used in the method B may be prepared by using both the phenols and naphthols, or by using either of the two. The aldehyde which may be used for the synthesis of the starting phenolic resin may be any one selected from those that have conventionally been used for the synthesis of phenolic resins, such as formaldehyde, acetaldehyde, benzaldehyde and salicylaldehyde. These aldehydes may be used individually or in combination of two or more.

The phenolic resin to be used in the method B may be of any molecular weight, such as a low molecular weight, a medium molecular weight or a high molecular weight, and generally, a preferred one is of a medium or high molecular weight, such as one of a number average molecular weight of 400 to 1,500, preferably 600 to 1,200.

Some examples of the naphthol and phenol that are to be added to the starting phenolic resin are the same ones as those that are exemplified above.

20 to 200 parts by weight, preferably 30 to 100 parts by weight of the naphthol, and 20 to 200 parts by weight, preferably 30 to 100 parts by weight of the phenol are used per 100 parts by weight of the phenolic resin. The total of the naphthol and phenol is generally 40 to 400 parts by weight, preferably 60 to 200 parts by weight, per 100 parts by weight of the phenolic resin. If the total of the naphthol and phenol is less than 40 parts by weight, the decrease in the molecular weight and polydispersity coefficient will be insufficient, and if it exceeds 400 parts by weight, the decrease in the molecular weight and polydispersity coefficient will be sufficient, but the removal of the remaining naphthol and phenol will become inefficient.

Some examples of the acid catalyst that is selected from the group consisting of the strong acid, a super acid and a mixture thereof and is to be used in the method B are the same ones as those to be used in the splitting-recombining reaction of method A. The amount of the acid catalyst to be used in the method B is generally 0.001 to 0.5 mol, preferably 0.005 to 0.1 mol per 100 g of the total of the phenolic resin, naphthol and phenol.

The splitting-recombining reaction in the method B is carried out under ambient pressure, at 120° to 180° C., preferably 130° to 170° C., for 1 to 12 hours, preferably 2 to 8 hours. During the splitting-recombining reaction, condensed water, etc. are distilled off, and equilibrium is reached. In the meantime, molecular weight and polydispersity coefficient are decreased.

After the splitting-recombining reaction, the reaction mixture is subjected to vacuum condensation and/or steam distillation to remove unreacted monomers in the same manner as in the method A. The vacuum concentration is carried out generally at 230° C. or lower, preferably 150° to 200° C. After the amounts of the unreacted monomers reached predetermined amounts, the resulting resin is taken out from the reaction vessel and is then cooled, to obtain a desired naphthol-modified phenolic resin.

Exclusive of the naphthol and phenol remaining unreacted, the naphthol-modified phenolic resin obtained by the method B generally has a number average molecular weight (Mn) of not more than 0.9 times that of the starting phenolic resin and a low polydispersity coefficient of 1.6 or less.

Although phenols with rigid skeleton structures, such as naphthols, could not be used for the conventional preparation of phenolic resins because the rigid skeleton structures impart the phenolic resins with a high softening point and a low flowability, both the method A and method B enable such phenols to be used for the synthesis of phenolic resins. That is, when used as the curing agents of epoxy resin molding materials for sealing electronic parts, phenolic resins wherein naphthol skeletons are incorporated by conventional methods improve the glass transition temperature and resistance to reflow cracking of the molding materials. However, such phenolic resins have been deterred from practical use as curing agents due to their high softening point and low moldability. The methods of the present invention enable efficient production of phenolic resins having a low molecular weight and a low polydispersity coefficient, thereby providing excellent curing agents having a low softening point and an improved flowability.

Hereinafter is described the epoxy resin molding material of the present invention which is suited to sealing electronic parts.

The epoxy resin molding material for sealing electronic parts of the present invention comprises an epoxy resin, the naphthol-modified phenolic resin that is prepared by the method A or method B of the present invention and has a low molecular weight and a low polydispersity coefficient, and an inorganic filler. The naphthol-modified phenolic resin is incorporated in the epoxy resin molding material for sealing electronic parts as a curing agent of the epoxy resin.

The epoxy resin to be used in the present invention is not particularly limited and may be selected from those which have conventionally been used for sealing electronic parts. Some examples include those having biphenyl skeleton, such as 4,4'-diglycidyl-3,3',5,5'-tetramethylbiphenylmethane, phenol novolac epoxy resins, o-cresol novolac epoxy resins, naphthol cresol novolac epoxy resins and alicyclic epoxy resins. Epoxy resins having biphenyl skeletons are particularly preferable because such epoxy resins endow the objective epoxy resin molding material for sealing electronic parts with low hygroscopicity, high moisture resistance and excellent resistance to reflow cracking. These epoxy resins may be used individually or in combination of two or more.

The naphthol-modified phenolic resins that are prepared by the methods of the present invention may be used individually or in combination of two or more as the curing agent of the epoxy resin. Generally, the naphthol-modified phenolic resin is used in an amount which provides 0.8 to 1.2, preferably 0.9 to 1.1 phenolic hydroxyl group per epoxy equivalent of the epoxy resin. According to demand, a curing accelerator may be incorporated to accelerate the curing reaction between epoxy groups and phenolic hydroxyl groups. Some examples of the curing accelerator include 1,8-diazabicyclo(5,4,0)undecene-7, triethylenediamine, tertiary amines, such as benzyldimethylamine, triethanolamine and diethylaminoethanol, imidazoles, such as 2-methylimidazole, 2-phenylimidazole, 2-phenyl-4-methylimidazole, organic phosphines, such as tributylphosphine, methyldiphenylphosphine, triphenylphosphine, diphenylphosphine and phenylphosphine, tetra-substituted phosphonium.tetra-substituted borates, such as tetraphenylphosphonium.tetraphenylborate, tetraphenylphosphonium.ethyltriphenylborate and tetrabutylphosphonium.tetrabutylborate, and tetraphenylborates, such as 2-ethyl-4-methylimidazole.tetraphenylborate and N-methylmorpholine.tetraphenylborate.

The curing accelerator is preferably incorporated in an amount of 0.005 to 3% by weight, more preferably 0.01 to 1% by weight based on the amount of the epoxy resin molding material for sealing electronic parts.

In the present invention, the inorganic filler is incorporated for decreasing hygroscopicity and coefficient of linear expansion and for improving thermal conductivity and strength, and some examples include powder or spherical beads of fused silica, glass, alumina, zircon, calcium silicate, calcium carbonate, silica nitride, boron nitride, beryllia, zirconia and potassium titanate. Also single crystal fibers thereof and glass fibers may be used. Among these inorganic fillers, fused silica is desirable to decrease coefficient of linear expansion, and alumina is desirable to improve thermal conductivity. The inorganic filler is preferably spherical in shape to increase flowability and to prevent abrasion of molds during molding.

These inorganic fillers may be used individually or in combination of two or more.

The amount of the inorganic filler used is generally 60 to 95% by volume, preferably 65 to 85% by volume, based on the epoxy resin molding material for sealing electronic parts.

According to demand, there may be incorporated other additives, for example, release agents, such as higher aliphatic acids, metal salts of higher aliphatic acids and ester wax, colorants, such as carbon black, coupling agents, such as γ-glycidoxypropyltrimethoxysilane, epoxysilane, aminosilane, ureidosilane, vinylsilane, alkylsilanes, organic titanates and aluminum alcoholates, and flame retardants.

EXAMPLES 1 TO 8 AND COMPARATIVE EXAMPLES 1 TO 3

EXAMPLE 1

In 2-liter flask equipped with a stirrer, a condenser and a thermometer were placed 481 g of 1-naphthol, 449 g of o-cresol, 203 g of 37% formaline and 2 ml of 2N hydrochloric acid, and reaction was carried out under reflux for 4 hours in an oil bath. After the reaction under reflux, the reaction mixture was heated to 150° C., and splitting-recombining reaction was then carried out at 150° C. for 4 hours under ambient pressure. The reaction mixture was then concentrated in vacuum for 3 hours at 180° C., to obtain a resin. The resin had a number average molecular weight (Mn) of 320, an unreacted naphthol content of 8% by weight, a polydispersity coefficient (Mw/Mn) of 1.4 and a softening point of 97° C.

Measurements of number average molecular weight (Mn) and polydispersity coefficient were carried out by using a high speed liquid chromatography L6000 (trade name, produced by Hitachi Corporation) and a data analyzer C-R4A (trade name, produced by Shimazu Seisakusho Kabushiki Kaisha). The GPC column used for the analysis was G2000H$_{XL}$+G3000H$_{XL}$) (trade name, produced by Toso Kabushiki Kaisha). The measurements were carried out under the conditions of a sample concentration of 0.2%, a mobile phase of tetrahydrofuran and a flow rate of 1.0 ml/min. Number average molecular weight was calculated by using a calibration curve which was made by using polystyrene standard samples.

72 parts by weight of the obtained resin, 80 parts by weight of a methyl-substituted biphenyl-skeleton epoxy resin (trade name: YX-4000H, produced by Yuka Shell Epoxy Kabushiki Kaisha) of an epoxy equivalent of 190, 2.5 parts by weight of triphenylphosphine, 3 parts by weight of carnauva wax, 1 part by weight of carbon black, 4 parts by weight of γ-glycidoxypropyltrimethoxysilane and 825 parts by weight of fused silica powder were kneaded by heated roles of 10 in. in diameter at 80° to 90° C. for 7 to 10 minutes, to obtain an epoxy resin molding material for sealing electronic parts.

The spiral flow, glass transition temperature, flexural modulus and resistance to reflow cracking of the obtained epoxy resin molding material were measured.

These properties were measured according to the following testing methods.

The testing pieces and flat packages, that were used in the following tests, were produced by conducting molding at 180° C. for 90 seconds under a pressure of 6.9 MPa, followed by after curing at 180° C. for 5 hours.

Measurement of spiral flow was carried out at 180° C. under a pressure of 6.9 MPa according to EMM-I-66 (unit: cm).

Measurement of glass transition temperature was carried out with a thermomechanical analyzer (trade name: TMA-8141BS, TAS-100, produced. by Rigaku Denki Kabushiki Kaisha) at a rate of heating of 5° C./min by using a testing piece of 19 mm×4 mm×4 mm (unit: ° C.).

Measurement of flexural modulus was carried out with TENSILON (trade name, produced by Toyo Boldwin Kabushiki Kaisha) by bending test of three points supporting type according to JIS-K-6911 (unit: GPa).

Measurement of resistance to reflow cracking was carried out by making QFP(flat package)-type IC (sizes of flat package: 19 mm×14 mm×2 mm) packages each containing an element of 6 mm×6 mm and being equipped with 54 pins and 42 alloy lead wires, allowing each package to stand in moist atmosphere of 85° C./85% RH for a predetermined time as listed in Table 1, and visually observing package cracks after fellow soldering at 215° C. for 90 seconds.

The reaction of this Example 1 was repeated with the exception that the time of the splitting-recombining reaction was varied, and the relationships between the time of the splitting-recombining reaction and the composition, molecular weight and molecular weight distribution of the resulting resins are shown in FIGS. 1 to 3.

FIG. 1 represents the relationship between the time of the splitting-recombining reaction and the contents of dimer, trimer and tetramet or higher molecular weight components in the resins, FIG. 2 represents the relationship between the time of the splitting-recombining reaction and the number average molecular weight of the resins, and FIG. 3 represents the relationship between the time of the splitting-recombining reaction and the polydispersity coefficient of the resins.

EXAMPLES 2 TO 6

Various naphthol-modified phenolic resins and various epoxy resin molding materials for sealing electronic parts were prepared by repeating the procedure of Example 1 with the exception that the preparation conditions were varied as listed in Table 1.

The spiral flow, glass transition temperature, flexural modulus and resistance to reflow cracking of the epoxy resin molding materials were measured and are listed in Table 1.

EXAMPLE 7

In a 2-liter flask equipped with a stirrer, a condenser and a thermometer were placed 481 g of 1-naphthol, 449 g of o-cresol, 243 g of 37% formaline and 2 ml of 2N hydrochloric acid, and reaction was carried out in an oil bath for 4 hours under reflux. After the reflux reaction, the resulting reaction mixture was concentrated at 180° C. for 3 hours under reduced pressure of 700 mmHg to obtain a resin. The resin had a number average molecular weight of 570, an unreacted naphthol content of 1% by weight, a polydispersity coefficient of 2.19 and a softening point of 134° C.

100 g of the obtained resin, 16.7 g of 1-naphthol, 50 g of o-cresol and 0.5 ml of 2N hydrochloric acid were placed in a 500 ml flask. Reaction was carried out for 4 hours at 140° C., and then vacuum concentration was carried out at 180° C. under reduced pressure of 20 mmHg, to obtain 105 g of a resin. The resulting resin had a number average molecular weight of 320, an unreacted naphthol content of 7% by weight, a polydispersity coefficient of 1.36 and a softening point of 87° C.

Figure 4:
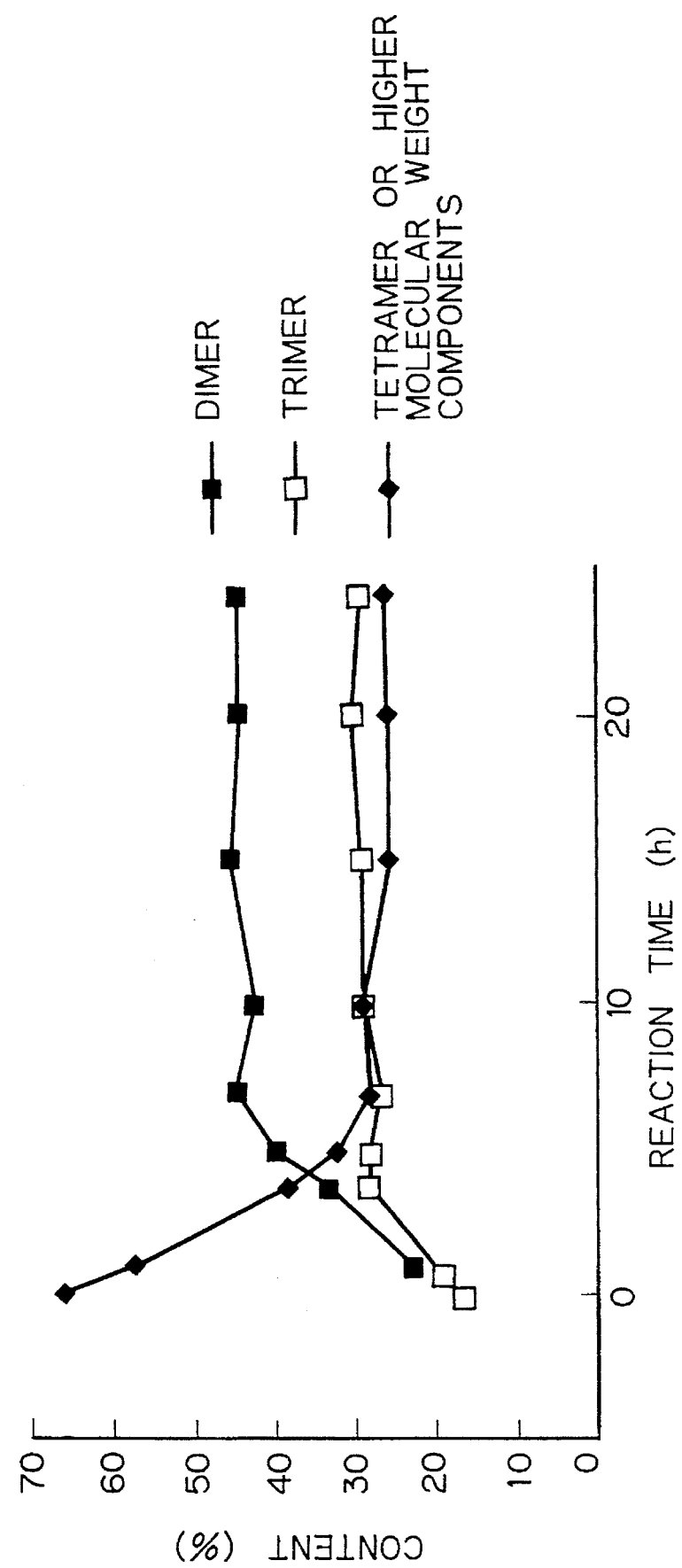
FIG. 4 is a graph representing the relationship between reaction time and composition of reaction product during the reaction of Example 7 which is an embodiment according to the present invention.
Figure 5:
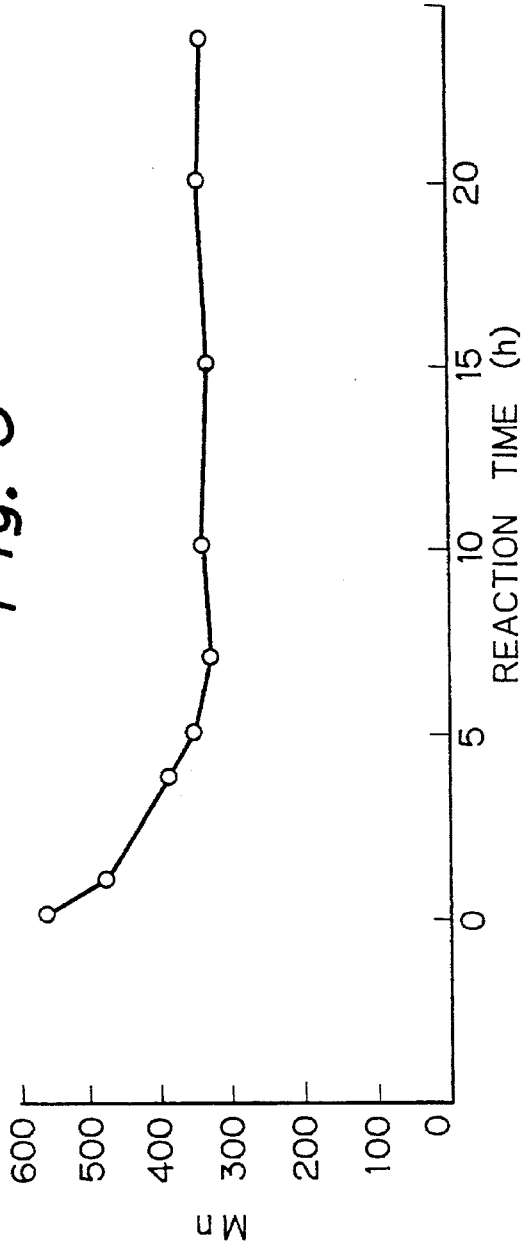
FIG. 5 is a graph representing the relationship between reaction time and number average molecular weight of reaction product during the reaction of Example 7 which is an embodiment according to the present invention.
Figure 6:
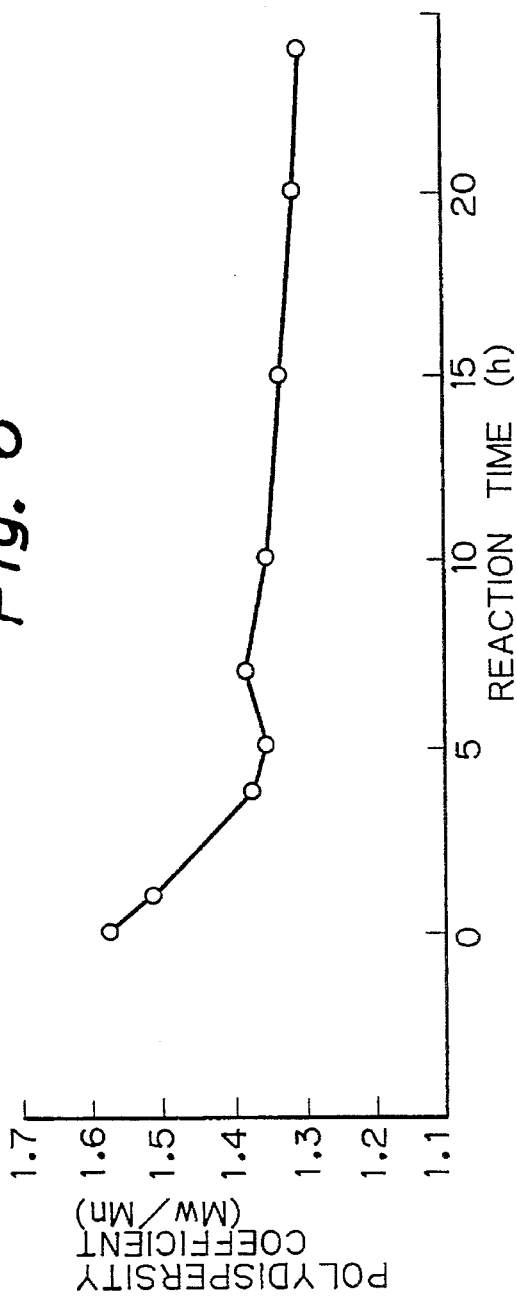
FIG. 6 is a graph representing the relationship between reaction time and polydispersity coefficient of reaction product during the reaction of Example 7 which is an embodiment according to the present invention.

The reaction of this Example 7 was repeated with the exception that the reaction time of the splitting-recombining reaction was varied, and the relationships between the time of the splitting-RECOMBINING reaction and the composition, molecular weight and molecular weight distribution of the resulting resins are shown in FIGS. 4 to 6.

FIG. 4 represents the relationship between the time of the splitting-recombining reaction and the contents of dimer, trimer and tetramet or higher molecular weight components in the resins, FIG. 5 represents the relationship between the time of the splitting-recombining reaction and the number average molecular weight of the resins, and FIG. 6 represents the relationship between the time of the splitting-recombining reaction and the polydispersity coefficient (Mw/Mn) of the resins.

EXAMPLE 8

In 2-liter flask equipped with a stirrer, a condenser and a thermometer were placed 481 g of 1naphthol, 449 g of o-cresol, 222 g of 37% formaline and 1 g of oxalic acid, and reaction was carried out in an oil bath for 4 hours under reflux. After the reflux reaction, the reaction mixture was heated to 150° C. 0.54 ml of trifluoromethanesulfonic acid was added to the heated reaction mixture, and reaction was then carried out for 4 hours at 150° C. The resulting reaction mixture was then concentrated for 3 hours at 180° C. under reduced pressure of 10 mmHg, to obtain a resin. The resin had a number average molecular weight of 380, an unreacted naphthol content of 8% by weight, a polydispersity coefficient of 1.36 and a softening point of 88° C.

COMPARATIVE EXAMPLES 1 AND 2

Naphthol-modified phenolic resins were prepared in the same manner as in Example 1 under the conditions as listed in Table 1 with the exception that the splitting-recombining reaction following reflux reaction was not carried out. Epoxy resin molding materials were prepared in the same manner as in Example 1. In Table 1 are listed the softening points, number average molecular weights, polydispersity coefficients and yields of the obtained resins and the spiral flows, glass transition temperatures, flexural modulus and resistance to reflow cracking of the obtained epoxy resin molding materials.

COMPARATIVE EXAMPLE 3

An epoxy resin molding material was prepared in the same manner as in Example 1 with the exception that a commercial phenolic resin having the following structure (trade name: ZAIROCK RESIN XL-225, produced by Mitsui Toatsu Chemicals, Inc.) was used as a curing agent. In Table 1 are listed the spiral flow, glass transition temperature, flexural modulus and resistance to reflow cracking of the epoxy resin molding material.

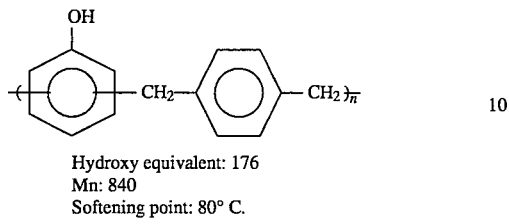

Hydroxy equivalent: 176
Mn: 840
Softening point: 80° C.

TABLE 1

|  | Examples |  |  |  |  |  | Comp. Exs. |  |  |
|---|---|---|---|---|---|---|---|---|---|
|  | 1 | 2 | 3 | 4 | 5 | 6 | 1 | 2 | 3 |
| 1-Naphthol (g) | 481 | 576 | 576 | 577 | 400 | 577 | 481 | 547 | — |
| 2-Naphthol (g) | — | — | — | — | 177 | — | — | — | — |
| p-Cresol (g) | — | — | — | — | 240 | — | — | 410 | — |
| o-Cresol (g) | 449 | 259 | 173 | 480 | 240 | 480 | 449 | — | — |
| 37% F[1] (g) | 203 | 208 | 227 | 330 | 160 | 315 | 203 | 122 | — |
| 80% PFA[2] (g) | — | — | — | — | 74 | — | — | — | — |
| 2N HCl (ml) | 2 | 2 | 2 | — | — | — | 2 | 2 | — |
| TFMS[3] (ml) | — | — | — | 0.6 | 0.6 | 0.5 | — | — | — |
| Reflux reaction Time (h) | 4 | 4 | 4 | 4 | 4 | 4 | 4 | 4 | — |
| Splitting-recombining reaction |  |  |  |  |  |  |  |  |  |
| Temp (°C.) | 150 | 160 | 150 | 150 | 140 | 150 | — | — | — |
| Time (h) | 4 | 4 | 4 | 7 | 7 | 6 | — | — | — |
| Concentration Time (h) | 3 | 3 | 3 | 3 | 3 | 3 | 4 | 4 | — |
| $N^4/P^5$ | 0.8 | 1.7 | 2.5 | 0.9 | 0.9 | 0.9 | 0.8 | 0.8 | — |
| $F^6/(N^4 + P^5)$ | 0.3 | 0.40 | 0.5 | 0.49 | 0.47 | 0.46 | 0.33 | 0.2 | — |
| $TS^7$ (°C.) | 97 | 98 | 110 | 115 | 108 | 105 | 134 | 92 | — |
| Mn | 320 | 371 | 522 | 475 | 450 | 422 | 557 | 330 | — |
| Mw/Mn | 1.44 | 1.35 | 1.51 | 1.56 | 1.49 | 1.42 | 1.62 | 1.45 | — |
| Yield (g) | 630 | 650 | 720 | 870 | 860 | 870 | 610 | 530 | — |
| Spiral flow | 75 | 70 | 70 | 73 | 73 | 83 | 55 | 70 | 80 |
| $Tg^8$ | 135 | 144 | 149 | 142 | 142 | 140 | 145 | 135 | 115 |
| Flexural Modulus | 22.4 | 23.9 | 23.9 | 23.5 | 22.6 | 21.0 | 24.0 | 22.6 | 23.0 |
| Resistance to reflow cracking ($X^9/Y^{10}$) |  |  |  |  |  |  |  |  |  |
| 18 h | 0/5 | 0/5 | 0/5 | 0/5 | 0/5 | 0/5 | 0/5 | 0/5 | 0/5 |
| 24 h | 0/5 | 0/5 | 0/5 | 0/5 | 0/5 | 0/5 | 1/5 | 0/5 | 0/5 |
| 36 h | 0/5 | 0/5 | 0/5 | 0/5 | 1/5 | 0/5 | 5/5 | 2/5 | 0/5 |
| 48 h | 2/5 | 5/5 | 5/5 | 3/5 | 5/5 | 1/5 | 5/5 | 5/5 | 2/5 |

[1] formaline
[2] paraformaldehyde,
[3] trifluoromethanesulfonic acid
[4] naphthol
[5] phenol
[6] formaldehyde
[7] softening point
[8] glass transition temperature
[9] number of cracked packages
[10] number of tested packages The results listed in Table 1 show that the epoxy resin molding material for sealing electronic parts of the present invention has good flowability, high glass transition temperature and excellent resistance to fellow cracking.

What is claimed is:

1. A method of preparing a naphthol-modified phenolic resin comprising allowing a naphthol and a phenol to react with an aldehyde in the presence of an acid catalyst at 60° to 110° C. to obtain a primary reaction mixture, heating the primary reaction mixture in the presence of an acid catalyst selected from the group consisting of a strong acid selected from the group consisting of hydrochloric acid, sulfuric acid, nitric acid, p-toluenesulfonic acid and a halogenated acetic acid, a super acid having a Hammett's acidity function of $H_o < -11.93$, and a mixture thereof under ambient pressure, at 120° to 180° C., for 1 to 12 hours, to obtain a secondary reaction mixture, and subjecting the secondary reaction mixture to vacuum concentration and/or steam distillation to obtain the naphthol-modified phenolic resin.

2. The method of claim 1, wherein the naphthol is used in an amount of 20 to 90 mol % based on total of the naphthol and the phenol, and 0.3 to 1.0 mol of the aldehyde is used per mol of total of the naphthol and the phenol.

3. The method of claim 2, wherein the naphthol is selected from the group consisting of 1-naphthol, 2-naphthol, 1,5-dihydroxynaphthalene, 1,6-dihydroxynaphthalene, 1,7-dihydroxynaphthalene, 2,7-dihydroxynaphthalene and a mixture thereof, the phenol is selected from the group consisting of phenol, o-cresol, p-cresol, m-cresol, a butylphenol, a xylenol, a nonylphenol, a fluorene-type phenol and a mixture thereof, the aldehyde is selected from the group consisting of formaldehyde, acetaldehyde, benzaldehyde, salicylaldehyde and a mixture thereof, the strong acid hydrochloric acid, and the super acid is selected from the group consisting of trifluoromethanesulfonic acid, methanesulfonic acid and pentafluoroethanesulfonic acid.

4. The method of claim 1, wherein the acid catalyst used for the preparation of the primary reaction mixture is the acid catalyst selected from the group consisting of the strong acid, the super acid and the mixture thereof, and the heating of the primary reaction mixture for obtaining the secondary reaction mixture is carried out without further addition of the acid catalyst.

5. The method of claim 4, wherein the naphthol is used in an amount of 20 to 90 mol % based on total of the naphthol and the phenol, and 0.3 to 1.0 mol of the aldehyde is used per mol of total of the naphthol and the phenol.

6. The method of claim 5, wherein the naphthol is 1-naphthol or 2-naphthol, the phenol is p-cresol or o-cresol, the aldehyde is formaldehyde, and the acid catalyst selected from the group consisting of the strong acid, the super acid and the mixture thereof is hydrochloric acid or trifluoromethanesulfonic acid, and the secondary reaction mixture is subjected to the vacuum concentration.

7. The method of claim 1, wherein the acid catalyst used for the preparation of the primary reaction mixture is a weak acid selected from the group consisting of oxalic acid, acetic acid and formic acid, and the heating of the primary reaction mixture for obtaining the secondary reaction mixture is carried out after the acid catalyst selected from the group consisting of the strong acid, the super acid and the mixture thereof is added to the obtained primary reaction mixture.

8. The method of claim 7, wherein the naphthol is used in an amount of 20 to 90 mol % based on total of the naphthol and the phenol, and 0.3 to 1.0 mol of the aldehyde is used per mol of total of the naphthol and the phenol.

9. The method of claim 8, wherein the naphthol is 1-naphthol, the phenol is o-cresol, the aldehyde is formaldehyde, the weak catalyst is oxalic acid, the acid catalyst selected from the group consisting of the strong acid, the super acid and the mixture thereof is trifluoromethanesulfonic acid, and the secondary reaction mixture is subjected to the vacuum concentration.

\* \* \* \* \*